United States Patent [19]
Acocella et al.

[11] Patent Number: 5,892,257
[45] Date of Patent: Apr. 6, 1999

[54] PACKING DENSITY FOR FLASH MEMORIES

[75] Inventors: Joyce Elizabeth Acocella, Hopewell Junction, N.Y.; Carol Galli, Odenton, Md.; Louis Lu-Chen Hsu, Fishkill, N.Y.; Seiki Ogura, Hopewell Junction, N.Y.; Nivo Rovedo, LaGrangeville, N.Y.; Joseph Francis Shepard, Hopewell Junction, N.Y.

[73] Assignee: International Business Machines Corporation, Armonk, N.Y.

[21] Appl. No.: 708,432

[22] Filed: Sep. 5, 1996

Related U.S. Application Data

[62] Division of Ser. No. 319,393, Oct. 6, 1994, Pat. No. 5,622,881.

[51] Int. Cl.⁶ ................................................. H01L 29/788
[52] U.S. Cl. ........................................... 257/316; 257/315
[58] Field of Search ................................... 257/314, 315, 257/316, 389, 752; 437/43, 257; 438/257

[56] References Cited

U.S. PATENT DOCUMENTS

| | | | |
|---|---|---|---|
| 4,597,060 | 6/1986 | Mitchell et al. | 257/316 |
| 4,651,406 | 3/1987 | Shimizu et al. | 29/571 |
| 4,663,645 | 5/1987 | Komori et al. | 257/316 |
| 4,833,514 | 5/1989 | Esquivel et al. | 437/43 |
| 4,905,062 | 2/1990 | Esquivel et al. | 257/316 |
| 4,944,836 | 7/1990 | Beyer et al. | 156/645 |
| 4,997,781 | 3/1991 | Tigelaar | 437/43 |
| 5,032,881 | 7/1991 | Sardo et al. | 257/316 |
| 5,047,362 | 9/1991 | Bergemont | 257/316 |
| 5,120,670 | 6/1992 | Bergmont | 437/43 |
| 5,143,860 | 9/1992 | Mitchell et al. | 437/43 |
| 5,150,178 | 9/1992 | Mori | 257/315 |
| 5,179,427 | 1/1993 | Nakayama et al. | 257/316 |
| 5,324,972 | 6/1994 | Takebuchi et al. | 257/318 |
| 5,338,956 | 8/1994 | Nakamura | 257/316 |
| 5,401,992 | 3/1995 | Ono | 257/314 |
| 5,402,372 | 3/1995 | Bergemont | 257/321 |
| 5,541,130 | 7/1996 | Ogura et al. | 257/316 |

FOREIGN PATENT DOCUMENTS

| | | |
|---|---|---|
| 0354860A1 | 2/1990 | European Pat. Off. . |
| 0416574A2 | 3/1991 | European Pat. Off. . |
| 0416574A3 | 3/1991 | European Pat. Off. . |
| 0461764A2 | 12/1991 | European Pat. Off. . |
| 0464432A2 | 1/1992 | European Pat. Off. . |
| 0464432A3 | 1/1992 | European Pat. Off. . |
| 4-186777 | 7/1992 | Japan ..................... 257/315 |
| 6-21473 | 1/1994 | Japan ..................... 257/315 |

OTHER PUBLICATIONS

Y.S. Hisamune, et al.. "3.6 $\mu m^2$ Memory Cell Structure for 16MB EPROMS", 1989, pp. 583–586.

"A New Self–Aligned Planar Array Cell for Ultra High Density EPROMS"; A. T. Mitchell et al.; Texas Instruments Incorporation; IEEE 1987; pp. 548–551.

*Primary Examiner*—Olik Chaudhuri
*Assistant Examiner*—Phat X. Cao
*Attorney, Agent, or Firm*—Whitham, Curtis, Whitham; Eric W. Petraske

[57] ABSTRACT

Improved packing density as well as improved performance and manufacturing yield is achieved in an electrically programmable memory by confining floating gate structures between isolation structures covered with a thin nitride layer. The confinement of the floating gate is achieved by planarization, preferably with a self-limiting chemical/mechanical polishing process, to the surface of the nitride layer covering the isolation structures. Gate oxide and control electrode connections can then be formed on a substantially planar surface without compromising the quality of the gate oxide or breakdown voltage the device must withstand for programming. Since severe topology is avoided over which these connections are formed, improved formation of low resistance connections, possibly including metal connections, are possible and allow scaling of transistors of the memory cells to be scaled to sizes not previously possible.

15 Claims, 10 Drawing Sheets

PACKING DENSITY FOR FLASH MEMORIES

This application is a divisional of application Ser. No. 08/319,393, filed on Oct. 6, 1994, now U.S Pat. No. 5,622,881.

BACKGROUND OF THE INVENTION

1. Field of the Invention

The present invention generally relates to programmable read only memories (PROMs), and more particularly, to so-called flash memories which are a form of electrically erasable programmable read only memories (EEPROMs) of high integration density.

2. Description of the Prior Art

Digital circuits and data processing systems in particular may use several different types of storage devices for various purposes and to derive various advantages from the respective characteristics thereof. For example, certain types of registers which provide output signals in a sequence which is fixed relative to the input sequence (e.g. first in-first out (FIFO) buffers) may avoid the need to store additional information regarding the identity of the data or how it may be later accessed while it is stored. Other types of memory structures allow data to be retrieved based on an address. Exemplary of the latter types of devices are random access memories and read only memories.

As is known, the former type of memory allows data stored therein to be changed at will at the expense of certain complexities of structure, such as providing for periodic refresh of dynamic RAMs or increased device counts in static RAMs. However, many of those complexities can be avoided in the latter type of memory where stored data is fixed or is only very infrequently changed. Many types of Read only memory are non-volatile and may be used to store commands or data regarding device operation during periods when the device may be disconnected from a power source.

When the application requires that data be changed from time to time, so-called programmable read only memories are often employed. Such memories often require special provisions such as irradiation with ultraviolet light or special purpose circuits to achieve rewriting of memory contents (the latter being referred to as electrically erasable read only memories (EEPROMs)) and often imposing low speed of response when cells must be individually erased and rewritten. To speed this process, so-called flash memories have been developed in which sections of memory are erased in a single operation and writing speed is enhanced.

EEPROMS in general and flash memories in particular operate by formation of a transistor with a so-called floating gate which is separated from a source of charge by a very thin oxide layer, generally referred to as a tunnelling oxide layer or simply tunnelling oxide. A control gate is formed over the floating gate but separated therefrom by a thicker oxide having a thickness similar to the gate oxide of a normal field effect transistor (FET). By applying a voltage to the control gate when charge has been placed below the floating gate by application of a suitable voltage, transfer of electrons through the tunnelling oxide for storage in the floating gate can be achieved. The charge stored in the floating gate can thereafter be detected by the conductance of the channel under the floating gate until the charge is removed by erasure.

One mechanism used in the rewriting of flash memories is channel hot electron (CHE) injection which generally requires an external high voltage power supply. However, a NAND type flash memory using Fowler-Nordheim tunnelling has been proposed using only a 5 volt power supply for all operations. The Fowler-Nordheim tunnelling mechanism avoids avalanche breakdown and greatly reduces the chance of hot hole injection into the tunnelling oxide which tends to reduce the amount of stored charge representing data. As a result of the reduction of hot hole injection, a ten-fold increase in data retention time relative to the CHE injection mechanism is achieved.

As in all other types of integrated circuits at the present time, there is much interest in increasing integration density so that more circuits and/or memory cells may be placed on a single chip. Unfortunately, processes currently used for production of all types of EEPROMS and especially flash memories using Fowler-Nordheim tunnelling mechanisms are not amenable to scaling in order to increase packing density. The decrease of size of the floating gate, in particular, reduces capacitive coupling to the floating gate normally employed for programming of the memory and thus reduces writing speed. Increase of word line and bit line resistivity also reduces writing speed and prior art designs have been constrained to the use of doped semiconductor material which has a significant specific resistance for interconnection of circuits contained in the memory.

Additionally, standard designs for EEPROMs of the double poly type which employ a first layer of polysilicon as the floating gate and a second layer of polysilicon as the control or select gate presents a topography problem which compromises quality of an oxide insulating layer used to separate them. Severe topology also restricts the use of metals in connections to elements of the memory since deposition of metals over severe topology is not fully reliable and may cause opens due to metal migration. Thus use of polysilicon for conductors rather than metal tends to increase resistivity. Further, when recessed oxide (ROX) isolation is used, the non-planar surface presents a problem with exposure resolution during lithographic patterning due to limitations on the defocus window (e.g. depth of field). This limitation is especially severe in high numerical aperture tools used for high speed exposure. These limitations can easily cause a reduction of throughput and/or a reduction of manufacturing yield; either of which tends to increase costs of EEPROMs.

Unfortunately, the severe topology actually has advantages in the operation of EEPROMS since it increases the so-called capacitance ratio: the ratio of the control gate capacitance to the capacitance of the floating gate or, more specifically, the ratio of the area of the control gate oxide to the area of the tunnelling oxide since the floating gate between the control gate and the substrate or well forms a capacitive voltage divider. This ratio must generally be kept above a particular value related to the programming voltage for operability and operational reliability increases with increase of this ratio at a given programming voltage. Since the tunnelling oxide is generally planar, the severe topology of the control gate oxide and the control gate, itself, increases the capacitance of the control gate and the capacitance ratio. Accordingly, severe topology has been conventionally tolerated in view of the increase in operational reliability it provides even though manufacturing yield is somewhat compromised.

SUMMARY OF THE INVENTION

It is therefore an object of the present invention to provide an EEPROM structure in which the topology problems and resultant losses in manufacturing yield inherent in prior art EEPROMS are avoided.

It is another object of the invention to provide an EEPROM structure in which the size of an individual cell can be reduced for increased packing density.

It is a further object of the invention to provide an EEPROM design in which metals and refractory metals can be used for interconnections of reduced resistivity.

In order to accomplish these and other objects of the invention, an electrically programmable memory is provided having a memory cell including a transistor having a floating gate and a control gate, said transistor including at least two isolation structures extending above a substrate at portions of a boundary of the transistor, a tunnelling oxide and the floating gate confined between the isolation structures, the floating gate having a surface substantially coplanar with a surface of the isolation structures and substantially parallel to a surface of the substrate on which the transistor is formed, and a gate insulator and control electrode formed on the coplanar surfaces of the floating gate and the isolation structures.

In accordance with another aspect of the invention, a method of fabricating an electrically programmable memory cell is provided including the steps of forming at least two isolation structures extending from a surface of a substrate, forming a nitride layer over the isolation structures, forming a tunnelling oxide layer and a floating gate layer extending at least between the isolation structures, and planarizing the floating gate to said nitride layer.

In accordance with a further aspect of the invention, a method of making a semiconductor device is provided including the steps of forming a pad oxide of a first thickness over an area of a semiconductor substrate, removing at least a first selected region of the pad oxide, regrowing oxide in the first selected region to a second thickness, removing at least a second selected region of the pad oxide, regrowing oxide in the second selected region to a third thickness.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
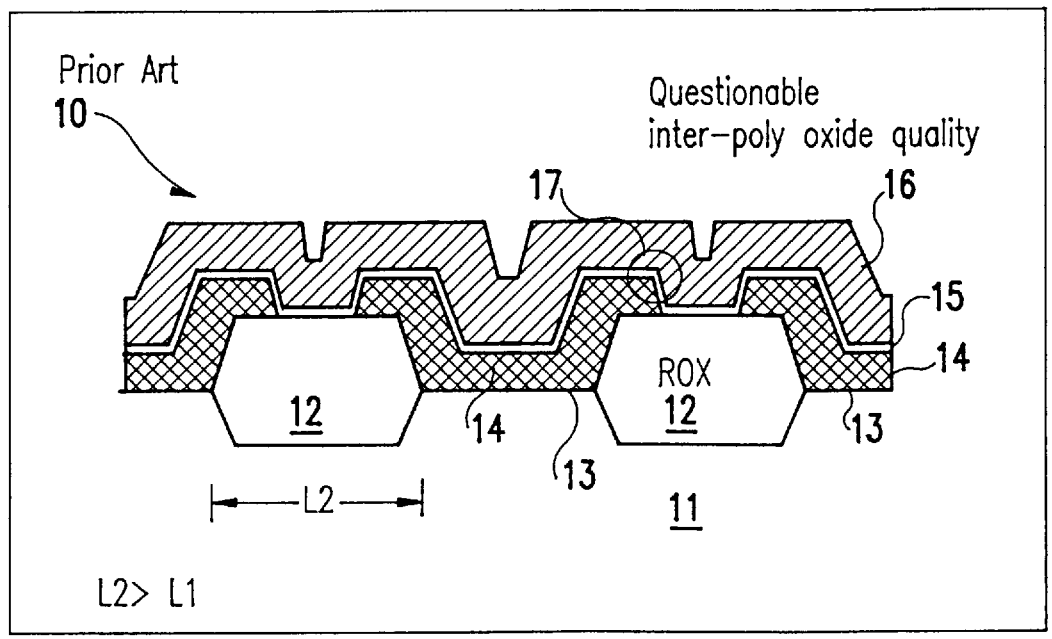
FIG. 1 is a simplified diagram of a double-poly EEPROM gate structure in accordance with the prior art.

Referring now to the drawings, and more particularly to FIG. 1, there is shown, in highly simplified form, an EEPROM gate structure 10 over which the present invention is an improvement. It is to be understood in this regard that no portion of FIG. 1 is admitted to be prior art as to the present invention. Rather, this highly simplified diagram is provided in an effort to provide an improved understanding of the problems which are overcome by the invention. In this structure, recessed oxide (ROX) 12 is used for isolation between adjacent gates. As will be discussed below in regard to operation of a preferred form of a flash memory in accordance with the invention, it is preferred that transistors including a floating gate for storage of charge be formed in very close proximity since the memory cells are programmed through a series connection of the source and drain regions of a plurality of such transistors. Therefore, isolation is generally necessary to minimize interaction between memory cells formed by those transistors.

In the EEPROM gate structure 10, a recessed oxide is formed and so called since a portion of the oxide 12 is recessed into the substrate 11. Regions between the ROX isolation structures are covered by a thin tunnelling oxide film 13. The floating gates 14 are formed of polysilicon and extend not only over the tunnelling oxide but over the sloping sidewalls and a portion of the surface of the ROX isolation structures 12. The floating gates 14 are separated by a distance at the upper surface of the ROX isolation structure which governs the breakdown voltage.

The floating gates 14 and exposed portions of the ROX isolation structures are covered with a control gate oxide layer 15 and a second polysilicon layer which serves as the control gate electrode 16. The area of the control gate oxide 15 between the control gate electrode 16 and the floating gate 14 establishes the capacitance therebetween. Therefore, it can be seen that the conventional structure imposes a trade-off between the capacitance value and the breakdown voltage for a given dimension L2 in a direction parallel to the substrate surface. Further, the severe surface topology of this structure tends to cause the control gate oxide (sometimes referred to as the inter-poly oxide) 15 to be of questionable quality in the encircled region 17 of the illustration of FIG. 1. Poor quality oxide in this region reduces breakdown voltage and imposes a further requirement that ample spacing between floating gates be provided to obtain acceptable manufacturing yields.

It should also be noted that, due to the extent of floating gate 14, L2 must be wider than the separation of floating gates 14 and tends to reduce the area of the tunnelling oxide. Therefore L2 must be sized in accordance with both the ratio of oxide areas to obtain a desired capacitance ratio and also in regard to breakdown voltage and floating gate separation, adjusted for the possibility of poor quality oxide, in order to obtain satisfactory manufacturing yields. The dimension L2 is thus a major portion of the "footprint" of an EEPROM cell which is not amenable to scaling to smaller sizes. This is particularly true since the very thin tunnelling oxide layer cannot be scaled in thickness consistent with reliability of formation; requiring certain minimum voltages to cause tunnelling and imposing limits on the minimum breakdown voltage which must be withstood by the device.

Figure 2:
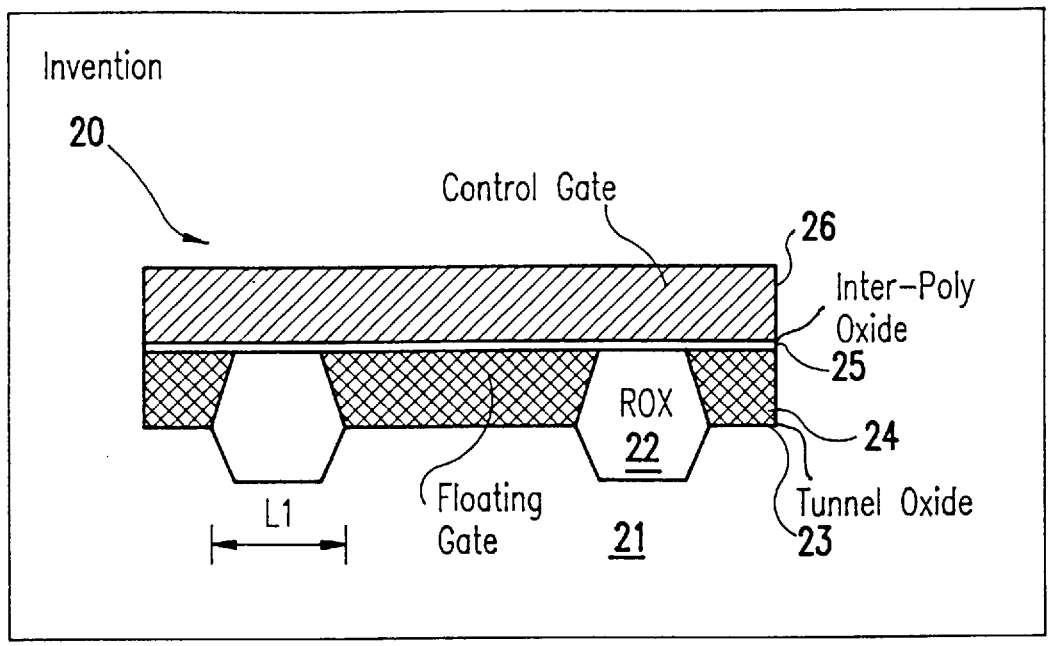
FIG. 2 is a simplified diagram of a double-poly EEPROM gate structure in accordance with the invention.

Referring now to FIG. 2, a simplified illustration of an EEPROM gate structure 20 in accordance with the invention is shown. An isolation oxide 22 is partially recessed into substrate 21 and partially protrudes therefrom, as in FIG. 1.

However, in accordance with the invention, after formation of the tunnelling oxide 23 and a first polysilicon layer 24, the polysilicon layer 24 is planarized. This planarization is preferably done by a simple and reliable chemical/mechanical polishing operation which, as will be discussed in greater detail below, can be made self-limiting. The planarization allows the inter-poly oxide 25 and the gate electrode to be formed on a planar surface without being compromised by surface topology. Further, no problems of lithographic exposure focus are encountered and metal or refractory metal can be used for connections.

However, the main advantages of the invention lie in the fact that the quality of the inter-poly oxide is not compromised at all by surface topology and the separation of adjacent floating gates is determined only by the width of the ROX isolation structures and which need be no larger for a given voltage bias to cause tunnelling than the separation between floating gates in the conventional structure of FIG. 1. Therefore, the design of FIG. 2 is scalable to much smaller sizes than that of FIG. 1. Further, while the capacitance ratio is reduced in the design in accordance with the invention by the elimination of severe surface topology, the design of FIG. 2 provides certain compensations therefor (e.g. increasing the percentage area of the memory cell which is occupied by the gate structure) so that reliability of operation is enhanced while permitting a substantial reduction in cell size.

Figure 3:
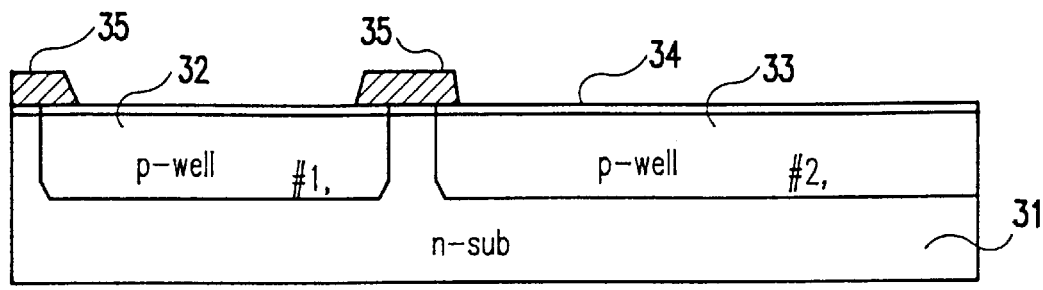
FIGS. 3, 4, 5, 6, 7, 8, 9, 10, 11, 12, 13, and 14 are cross-sectional views showing a fabrication sequence for a first embodiment of the invention.
Figure 4:
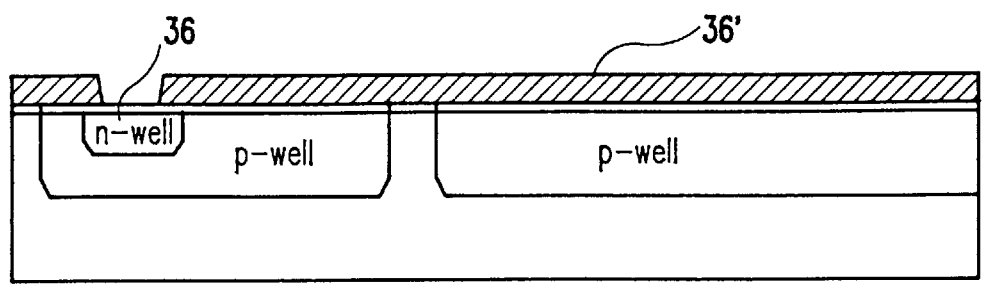

Referring now to FIGS. 3–14, fabrication of a first embodiment of the invention will now be discussed. FIG. 3 shows an n-type substrate 31 in which two p-wells 32, 33 have been formed. The p-well 32 at the left side of FIG. 3 will be used for formation of a peripheral circuit such as an exemplary CMOS pair of transistors capable of withstanding a relatively high (e.g. 12 volts) programming voltage for controlling writing to the EEPROM array which will be formed on the p-well 33 at the right. The two p-wells may be formed by any known process such as impurity implantation in accordance with mask 35 and diffusion. A protective dielectric layer 34 such as an oxide layer of about 150 Angstroms thickness and nitride of about 200 Angstroms thickness is preferably formed and maintained through any further processes for treatment of the substrate, such as the formation of n-well 36 as shown in FIG. 4, since implantation can be performed therethrough and removal of the layer assures that all masking material (e.g. 36') and contaminants will be fully removed for formation of structures above the substrate surface.

Figure 5:
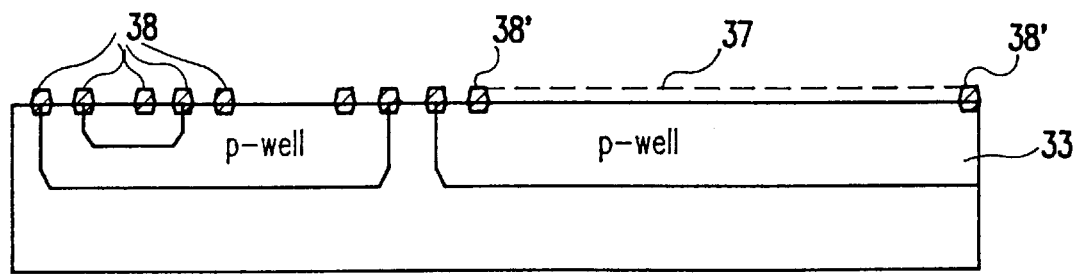
Figure 15:
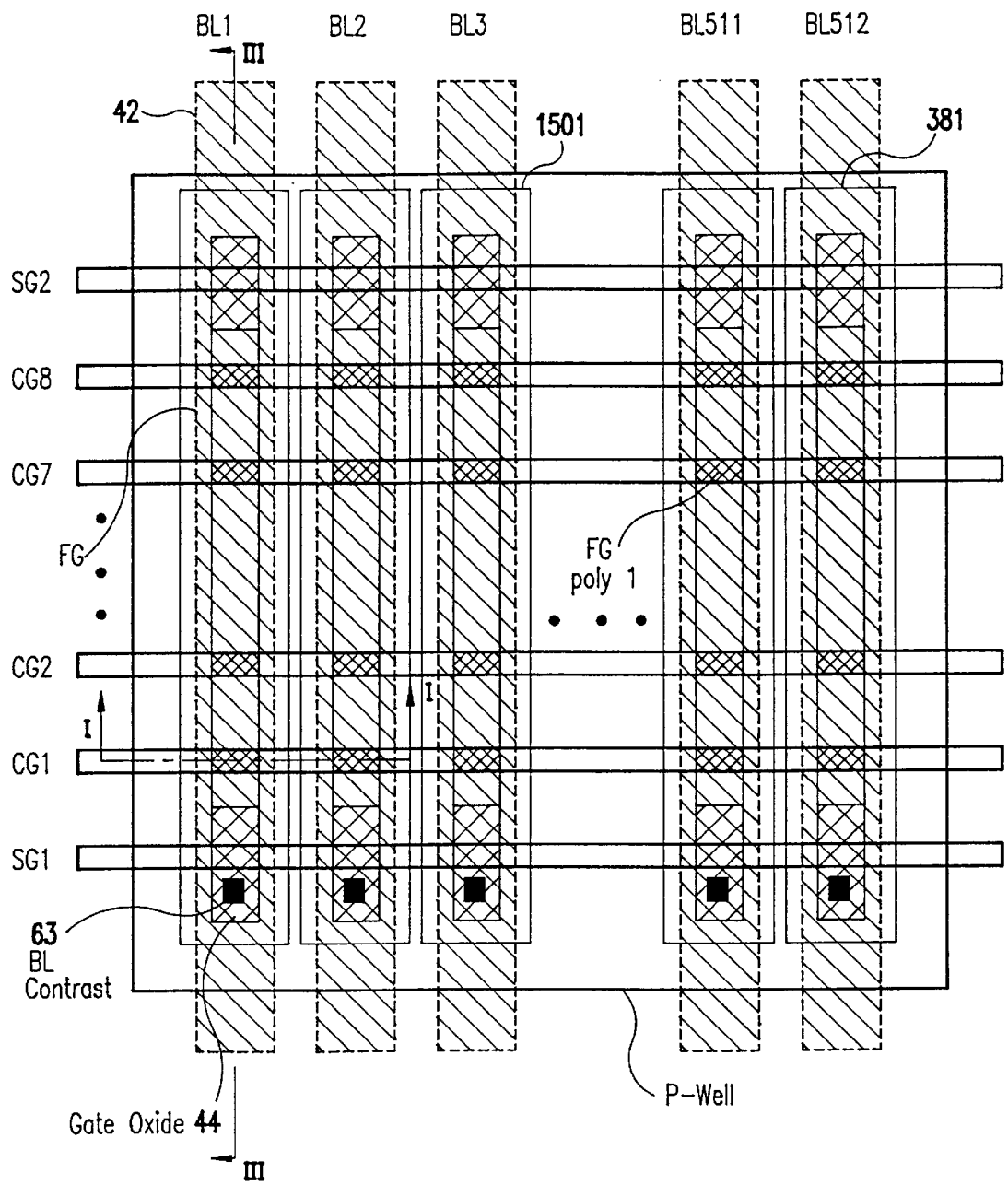
FIG. 15 is a plan view of the memory array portion of the structure formed in accordance with the process illustrated in FIGS. 3–14, FIGS. 16, 17 and 18 are cross-sectional views of a further exemplary embodiment of the invention taken along section line XVI—XVI of FIG. 23, FIGS. 19, 20 and 21 are cross-sectional views of the further exemplary embodiment of the invention taken along section line XIX—XIX of FIG. 23, FIGS. 22, 23, 24 and 25 are plan views of the further embodiment of the invention at various points in the fabrication thereof.

As shown in FIG. 5, certain areas of the substrate are recessed by etching, using a further mask (not shown) and recessed oxide isolation structures 38, 38" are formed which rise above the substrate surface. The dimension of rise of the ROX isolation structures should be controlled by control of oxidation time since they eventually will define the thickness (e.g. about 2000 Angstroms) of the floating gate structure. These isolation structures are located at the boundaries of the p-wells 32, 33 and n-well(s) 36 and at the locations where boundaries of other structures will be formed. The ROX isolation structures formed over p-well 33, where the memory cell array will be formed is actually a layer indicated by dashed line 37 having long, narrow rectangular apertures bounded at the ends by ROX structures 38". These rectangular apertures are shown more clearly at 1501 of the plan view of the device as illustrated in FIG. 15. Within these rectangular apertures the nitride/oxide layer 34 may now be readily stripped away.

Figure 6:
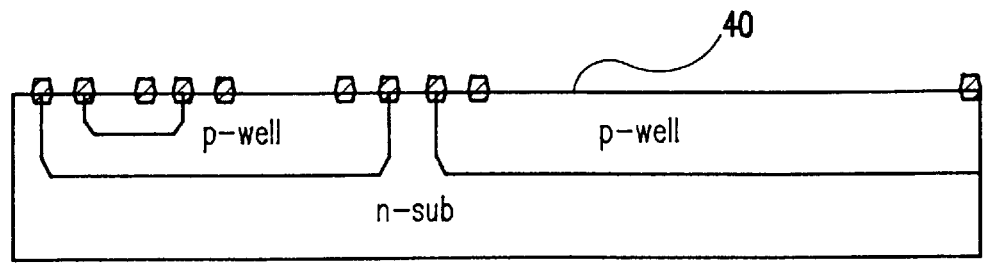

Referring now to FIG. 6, a pad oxide 40 of about 250 Angstroms thickness is grown. This oxide is referred to as a pad oxide since it has several functions and most of the layer is sacrificial and will be removed, as will be explained in further detail below. Nevertheless, the thickness is somewhat important since a remaining portion will form the gate oxide of a select gate transistor (e.g. 58 and 58A of FIG. 14) which is used in the NAND type memory configuration used herein for the purpose of explanation of the invention. However, if such a transistor is not provided, it is to be understood that the thickness of pad oxide 40 is unimportant to the invention. Nevertheless, the formation of pad oxide 40 to a particular thickness is considered to be a distinctive feature of preferred forms of the invention since it allows different oxide structures, including a gate oxide for low voltage transistors, which will often be included in various types of EEPROMs, to be formed in a minimum of process steps.

After the formation of the pad oxide, a thin layer (e.g. 125 Angstroms) of nitride is then deposited over the pad oxide and the ROX isolation structures. This nitride layer is considered to be a particularly important feature of the invention since the greater hardness and resistance to a chemical/mechanical polishing processes (such as those disclosed in U.S. Pat. No. 4,671,852, to Beyer et al., using an alumina slurry and, more particularly, the process disclosed in U.S. Pat. No. 4,944,836, to Beyer et al., using a silicon nitride etch stop) is used to make planarization self-limiting.

Figure 7:
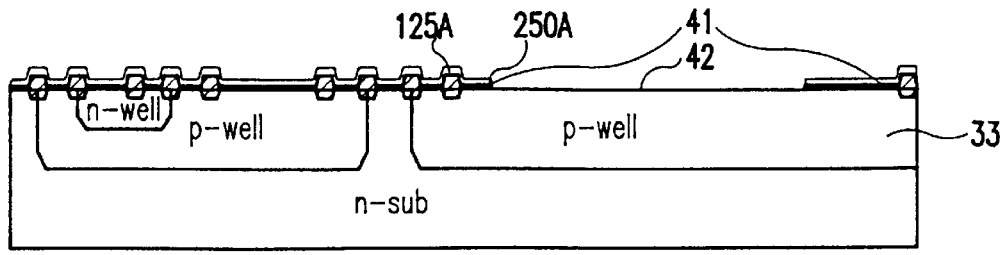
Figure 8:
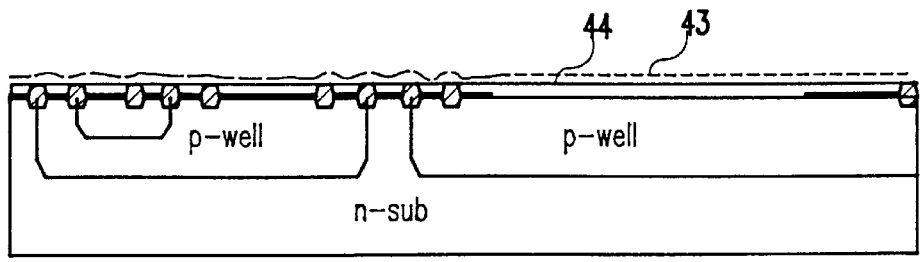

In regard to the different functions of various portions of the pad oxide 40, the nitride and oxide are first opened over the p-well 33 as shown at 41 and a thin tunnelling oxide 42 of approximately 100 Angstroms thickness is grown, as shown in FIG. 7. Then, as shown in FIG. 8, a first polysilicon layer is deposited as a blanket layer over the entire device, as indicated by dashed line 43. This blanket layer is then planarized to the surface of the nitride overlaying the ROX isolation structures, resulting in planar surface 44. This planarization also confines the floating gate structure within the height of protrusion of the ROX isolation structures and defines the thickness thereof in accordance with the invention as discussed above and with reference to FIG. 2.

Figure 9:
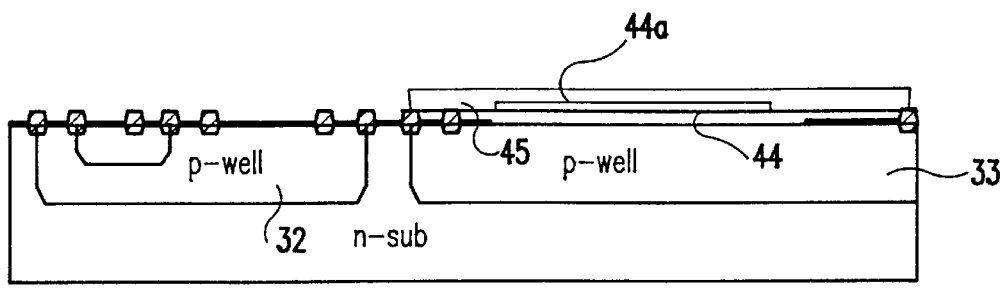
Figure 10:
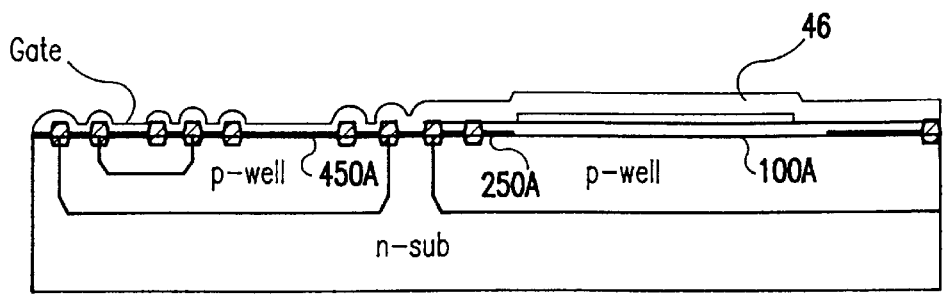

As shown in FIG. 9, the inter-poly oxide, preferably of an oxide-nitride-oxide (ONO) 44 composition and construction, is then grown and patterned using the same mask that was used to define open area 41 (but using a negative resist) by any of a plurality of known techniques, a thin layer of oxide and nitride 44a is deposited and a resist 45 is applied over the memory array area p-well 33 in order to remove the first polysilicon layer from p-well 32 and simultaneously protect the ONO layer 44. This also causes removal of the pad oxide 40 over p-well 32 where the peripheral circuit is to be formed, simultaneously removing all contaminants from that area. After the resist is removed, it should be noted that nitride still remains on top of the ONO layer 44 for protection during oxidation for forming the gate oxide (s) in the peripheral circuit. A gate oxide, which is preferably thicker (e.g. 450–500 Angstroms) to achieve higher breakdown voltage, is then regrown over the p-well 32. (At this point, only the portion of the pad oxide which is to be used as a gate oxide for select gate transistors 58, 58a of FIG. 14 in the memory array region remains, if any.) Then, as shown in FIG. 10, nitride 44a is removed and the second polysilicon layer 46 is deposited as a blanket layer over the entire device.

Figure 11:
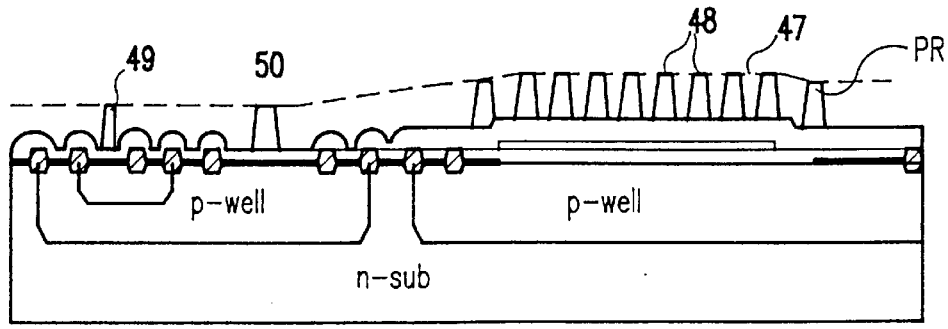
Figure 12:
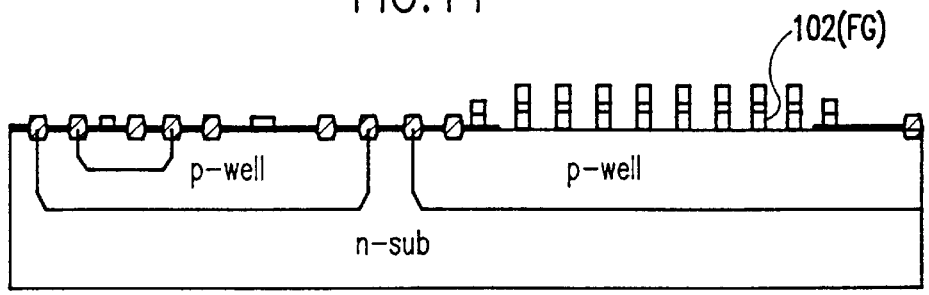

As shown in FIG. 11, gate lithography to pattern the second polysilicon layer is now performed by applying a resist layer, indicated by dashed line 47, and exposing and developing the resist to form a patterned mask with portions 48 defining gate structures in the memory array and other areas 49, 50 defining gates of transistors in the peripheral circuit area over p-well 32. After etching the polysilicon to the gate or tunnelling oxide in accordance with this resist mask and removal of the resist, the remaining portions of the first and second polysilicon layers and the inter-poly oxide appear as shown in FIG. 12. Referring briefly again to FIG. 15, it will be recalled that the floating gate polysilicon was contained between ROX isolation structures by the planarization process, as shown in FIG. 2 (corresponding to section I—I in FIG. 15). This etching step now separates the floating gate structures in the vertical direction (e.g. along section line III—III of FIG. 15) by etching through the first and second polysilicon layers and the inter-poly oxide and stopping at the tunnelling oxides between the ROX isolation structures 38, 38" to form the floating gates FG. However, it should also be realized that this etching step does not sever the ONO layer 44 and the second polysilicon layer 46 along the x–x" section of FIG. 15 (as also shown in FIG. 2) although the floating gates and tunnelling oxides are separated by being formed in the narrow rectangular apertures in the isolation structures bounded at the ends by ROX structures 38", as referred to above, and these lines formed of the second polysilicon layer thus form the control gate connections CG and select gate connections SG shown in FIG. 15 as well as the gate electrodes of the respective control and select transistors.

Figure 13:
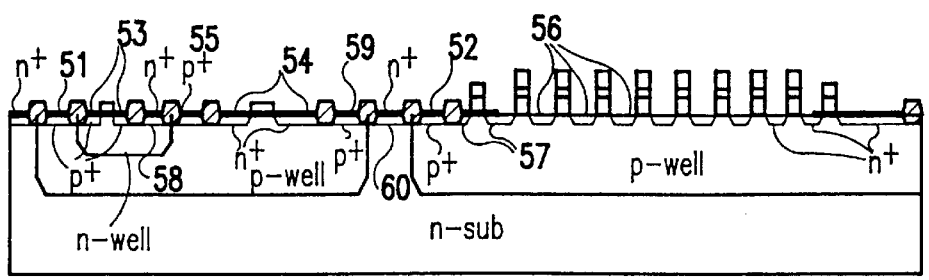

As shown in FIG. 13, ion implantation is now done in a largely self-aligned manner to form connections and to complete and enhance the operation of transistors formed around the gate structures. Specifically, p+ implants 55, 51, 52, 59 are formed to make electrical connections to the p-wells, similar p+ implants 53 and 57 are made to form source/drain regions of the PMOS transistors (e.g. in the peripheral circuit and the select gate transistors of the memory array). Similarly, n+ implant 58 is made to form a connection to the n-well in the peripheral circuit, n+ implant 60 is made to form a connection to the n-substrate, n+ implants 56 to form source/drain regions and serial connections between the memory cell transistors and the bit line connection pad, and n+ implants 54 are made to form the source/drain regions of the NMOS transistors in the peripheral circuit. It should be noted in this regard that all of the implants in the memory array except 52 are n+ implants and some of the p+ implants (e.g. 51, 53) are or can be arranged to be adjacent each other. Thus, the implantations can be done by known block-out implantation techniques and high resolution masking is not required. The memory structure is then completed by covering the structure with a protective dielectric 61 and metal bit line contact 62, as shown in FIG. 14.

Figure 14:
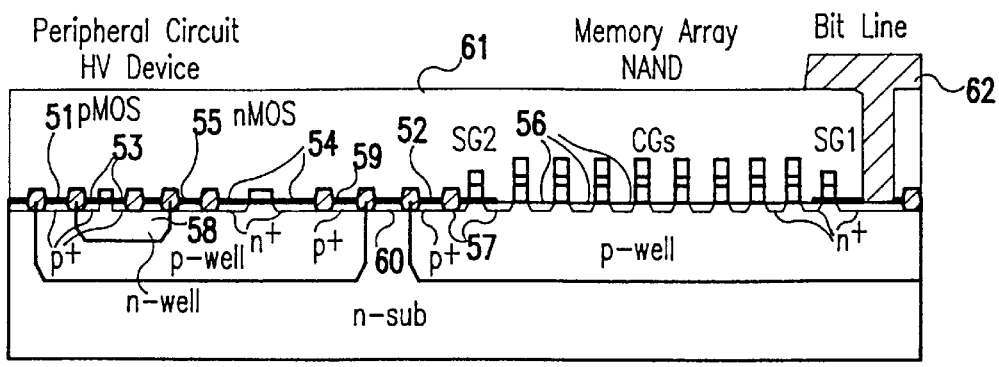

In operation, the NAND type of flash memory depicted in FIGS. 14 and 15, may be written to in order of the location of memory cells beginning, for example, at the end of the array most remote from the bit line connection formed by select gate transistor 58a because of the serial connection formed by n+ implants 56. Specifically, a programming voltage (e.g. 8.5 volts which is sufficient to cause tunnelling of electrons through the tunnelling oxide below the floating gate) is first applied to CG8 while the remainder of the transistors corresponding to the bit line are rendered conductive by a lower voltage (e.g. 3.5 volts) and data at one of two logic levels is applied through the bit line contact 63 to supply a source of electrons to the serial connection and ultimately to the floating gate of the transistor enabled through CG8.

To write to the next cell in the line, the voltage is removed from CG8 (e.g. CG8 is brought to ground potential to turn off the corresponding transistor, lowering the capacitance of the serial connection) and a high voltage applied to CG7 while a lower voltage is maintained on CG1–CG6, and so on. This process may be repeated for access to all memory cells. Supply of electrons for storage can also be regulated by select transistor (e.g. 58a forming SG1) connecting the bit line to the gate connections and gate electrodes yielding the NAND function of the memory.

It should be noted that the above mode of operation should be considered as exemplary since it involves only select gate SG1 formed by transistor 58a. Recalling that charge transfer is also impeded by the resistance of the bit line along which charge is transferred. For at least this latter reason, writing is commonly done from the center of the array outward. Therefore, as a practical matter and for optimum speed and reliability of operation, two select gates SG1, SG2, formed by transistors 58a, 58, respectively, are preferably used. As charge is supplied from the select gate, charge transfer along the bit line is terminated by storage in a memory cell in response to the increased voltage on a control gate in the manner described above. If select gates SG1 and SG2 are separately controlled along with appropriate application of voltages to the control gates, data may be written to the memory array alternately under control of the select gates. Charge transfer is also terminated along the bit lines by storage in accordance with a high voltage applied to selected control gates and a low voltage applied to the next subsequent control gate, as described above, simultaneous writing from both ends of the bit line is also possible.

Figure 16:
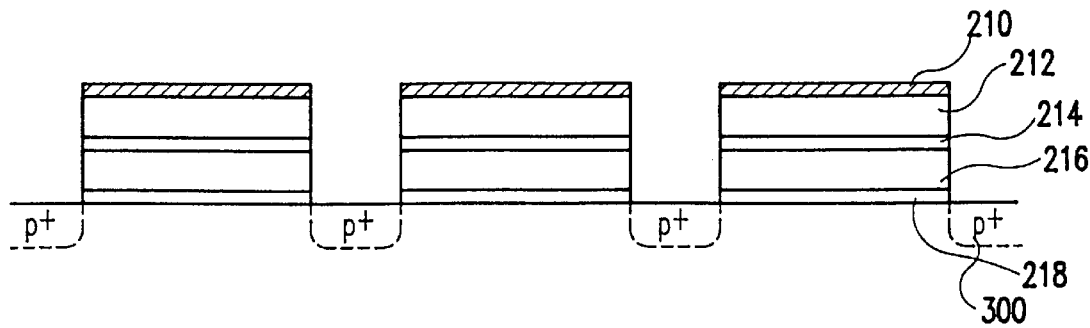
Figure 17:
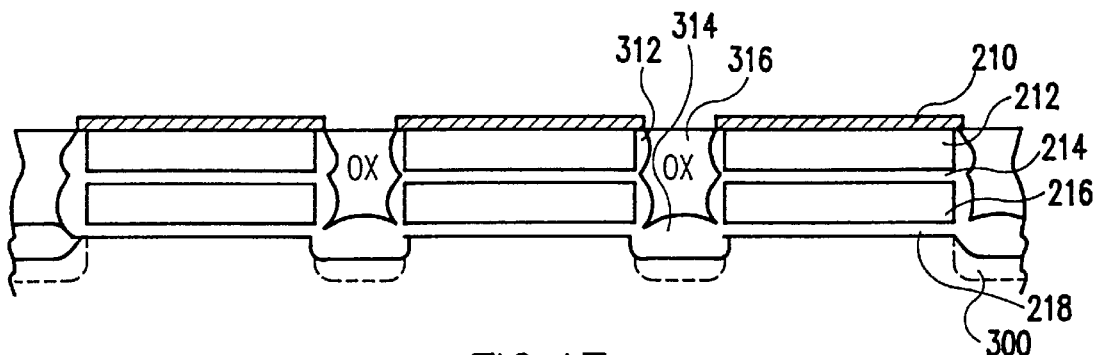
Figure 18:
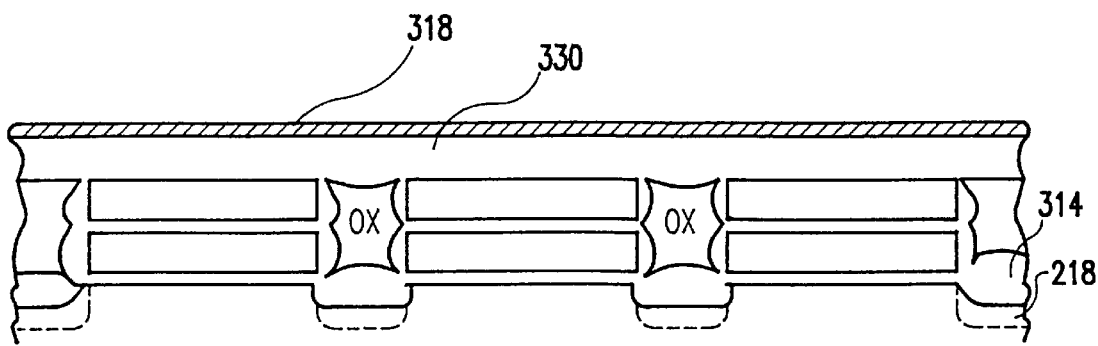
Figure 19:
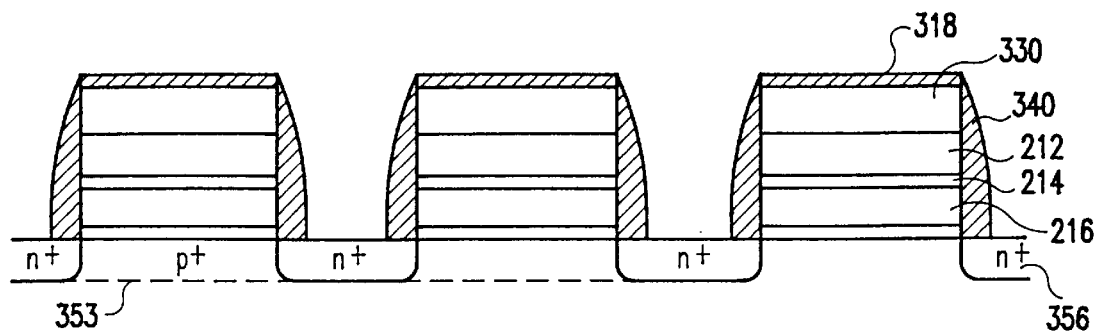
Figure 20:
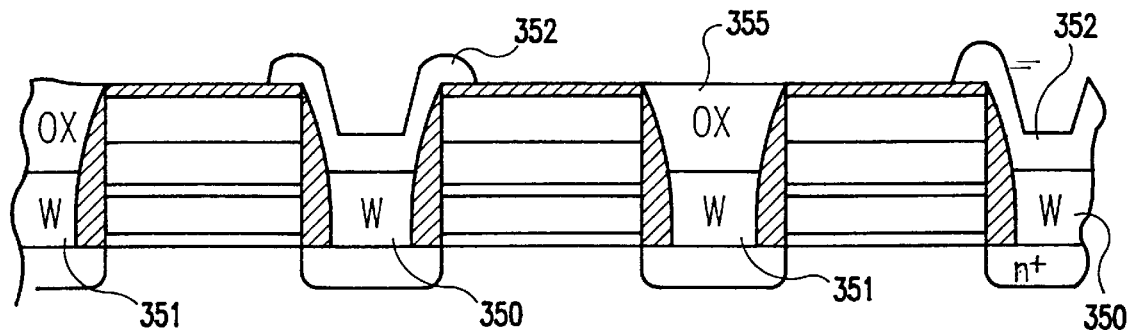
Figure 21:
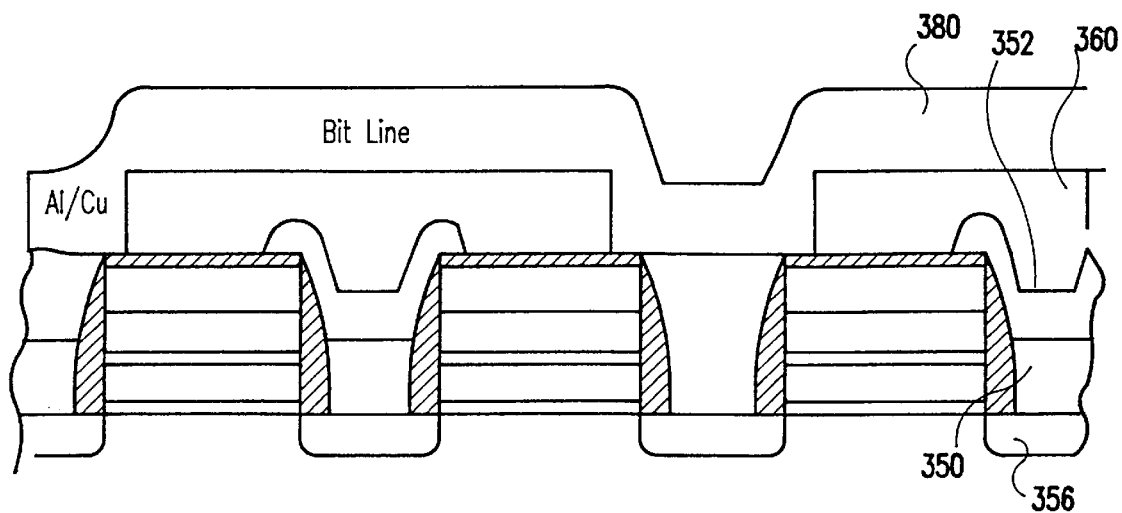
Figure 22:
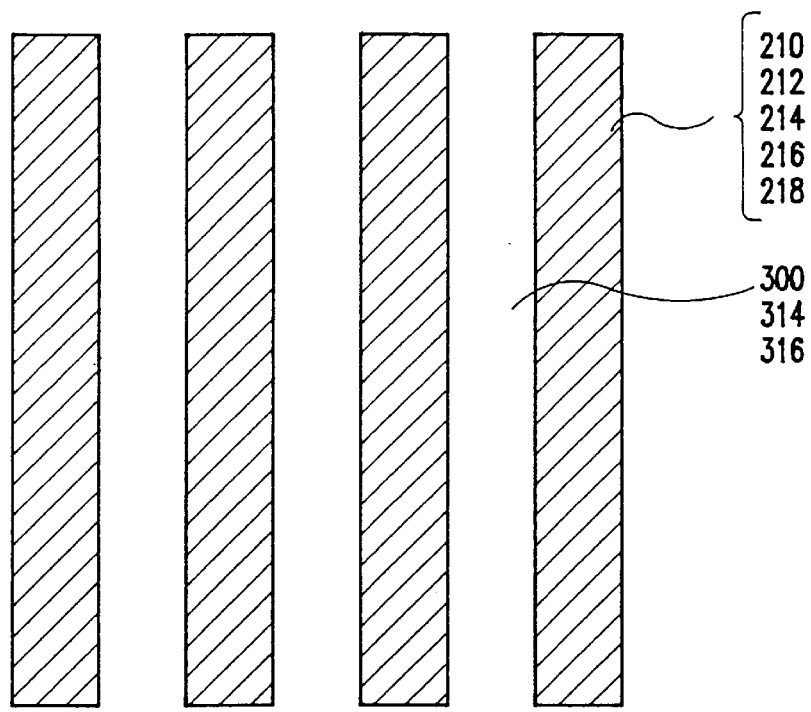
Figure 23:
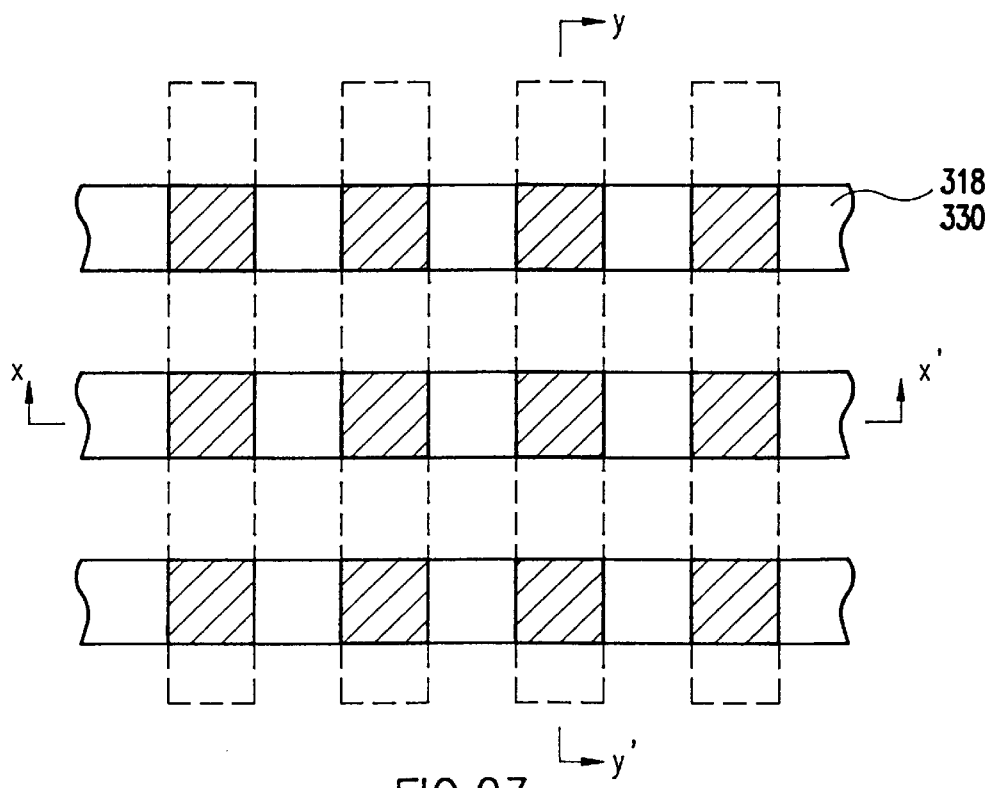

A second embodiment of the invention in which each memory cell is individually accessible (and does not require sequential writing) while retaining the high packing density of the previously described embodiment will now be described in connection with FIGS. 16–27; FIGS. 16–21 being sectional views, FIGS. 22–25 being corresponding plan views and FIG. 26 being a schematic diagram corresponding to the plan views. For clarity, only the memory array portion of the EEPROM is shown. The sectional views of FIGS. 16–18 are taken in the direction XVI—XVI and the sectional views of FIGS. 19–21 are taken in the direction XIX—XIX, both as shown in FIG. 23.

FIG. 16 shows a stage in the fabrication of the device which generally corresponds to FIG. 12 in the embodiment of the invention described above, after the formation, planarization and patterning of the multi-layer stack of the floating gate dielectric 218 the first polysilicon layer 216 (having a preferred n-type impurity concentration in the range of about $5 \times 10^{19}$ to $10^{21}/cm^3$), the control gate dielectric (preferably ONO) 214, the second polysilicon layer 212 (also having a preferred n-type impurity concentration in the range of about $5 \times 10^{19}$ to $10^{21}/cm^3$) and a protective nitride 210, all on a p-type substrate. The patterning is performed to form elongated narrow strips of the stack structure, preferably by reactive ion etching, as shown in the plan view of FIG. 22. Then, using the multi-layer stack structure and the protective top nitride layer 210, in particular, as a mask, a p+ isolation implant is made (to a preferred impurity concentration in the range to $5 \times 10^{16}$ to $10^{17}/cm^3$) in the p-type substrate to form isolation junction 300.

Once the isolation implant is performed, field oxide is grown in the isolation region 314 above the isolation implant (e.g. at 316) and on the sidewalls (e.g. at 312) of the multilayer stack structure. Further oxide 316 is then deposited, preferably by chemical vapor deposition (CVD), to fill the gaps between the stack structures and which now effectively becomes an isolation trench. This process also deposits oxide over nitride layer 210. However, the oxide overlying the nitride layer 210 is removed by planarization (preferably by a chemical-mechanical polish) back to the nitride layer to limit the oxide deposit 316 to the confines of the trench. The nitride layer 210 is then removed.

As shown in FIG. 18, a conductive layer, preferably of tungsten polycide 330 and a nitride layer 318 are deposited by CVD. These layers are then patterned in a direction generally orthogonal (but not necessarily at right angles) to the vertical (e.g. column-wise) patterning of the stack structure shown in FIG. 22 to form an array of horizontal (e.g. row) conductors connecting the transistor control gates 340 (formed from layer 212) as shown in FIGS. 16, 19 and 23. Thus, the remaining tungsten polycide forms wires on the planar surface which become word lines WL of FIG. 26. The formation of these connections on a planar surface crossing the isolation structures increases their reliability both for increase manufacturing yield and in service and thus obtains the same meritorious effects as the above-described embodiment of the invention. The patterned tungsten polycide and CVD nitride layers then can be used as a mask for etching the multi-layer stack structure to the substrate, thereby separating the elongated rectangular stack structures into individual memory cells with grooves parallel to the plane of the page in FIG. 18.

Referring now to FIG. 19, which, it will be recalled is a cross-sectional view taken along section XIX—XIX of FIG. 23 (e.g. parallel to the plane of the page of FIG. 18, yielding an end view of the word lines), nitride spacers are formed on the sidewalls of the stack structures (including the tungsten polycide layer), now separated into memory cells, and the sidewalls of the isolation structures between them which remain after etching in accordance with the tungsten polycide patterning. These sidewall spacers may be formed either symmetrically, as is preferred, or asymmetrically in width. The width of the spacers thus defines the regions of the source/drain n+ implantation in a self-aligned fashion to a preferred impurity concentration of $5 \times 10^{19}$ to $10^{21}/cm^3$. The implanted impurity is then diffused by heat treatment (e.g. annealing which also corrects crystal dislocations caused by the implantation process) to a desired profile (e.g. 350) as may be dictated by the desired properties of the transistors which are formed thereby. Other, additional, implantation and diffusion can also be done for the same purpose.

It will also be recalled the p+ isolation implantation discussed above in connection with FIG. 16 will now lie above and below the plane of the page of FIG. 19, as shown by dashed line 353. These isolation structures will remain in place and effective for isolation of the memory cells in a direction perpendicular to the page of FIG. 19 after the n+ implantation, as is well-understood in the art.

Figure 24:
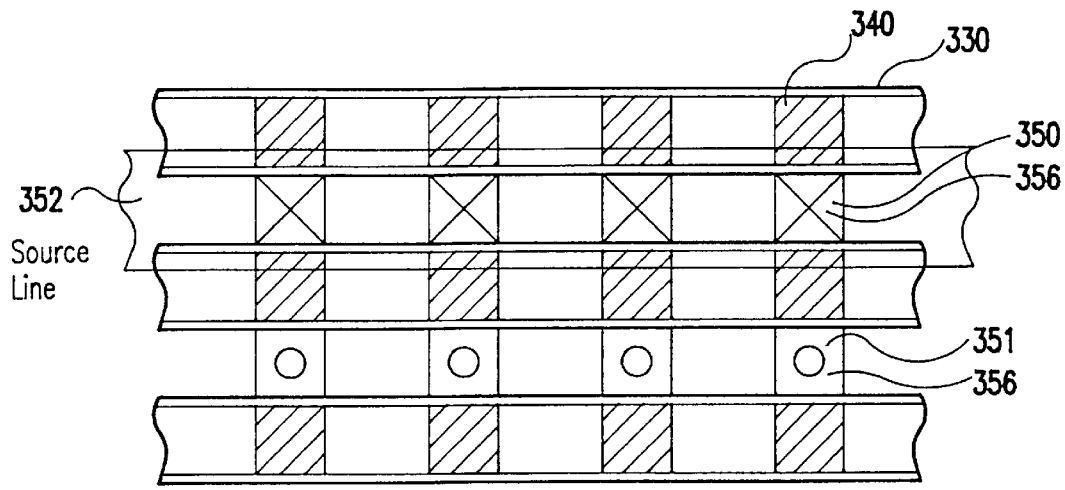

Tungsten 351 is then selectively deposited on the source/drain contact regions 350 (but not on the nitride) and sealed with CVD oxide 355, as shown in FIGS. 20 and 24. It should be noted that at this point, only the source and drain regions are exposed. The p+ isolation area is covered with field oxide 314 (FIG. 17). Therefore, selective tungsten may be selectively deposited on the semiconductor material including the n+ diffusion regions. This selective deposition greatly simplifies the fabrication of devices in accordance with preferred forms of the invention. Planarization of oxide 355 is optional. Then, as further shown in FIG. 20, alternate oxide plugs are removed by etching with a block out mask. This is a low-resolution process, well-understood in the art, which is highly reliable and of high manufacturing yield.

After formation of the source lines 352 (preferably of a conventional Cu/Al alloy) where oxide has been selectively removed, an insulating blanket layer 360 (preferably of CVD oxide) is formed to insulate them from the bit line 380 which will cross them. This blanket layer 360 is then patterned (also at relatively low resolution) to form individual vias at the remaining oxide plugs which alternate with the positions of the oxide plugs which were removed where source lines were formed, as discussed above. The alternate remaining oxide plugs are then removed and bit lines 380 formed (also preferably of conventional Cu/Al alloy) which reach alternate ones of the tungsten drain contacts 350 to functionally complete the EEPROM structure. The bit lines are also shown running in the vertical direction in FIG. 25. The topology of the surface on which the bit lines are formed is of little consequence since the bit lines can be formed as thick as desired and may substantially fill the volumes from which oxide plugs were removed. Of course, other layers such as a passivation layer or other circuits may be overlaid thereon.

Figure 25:
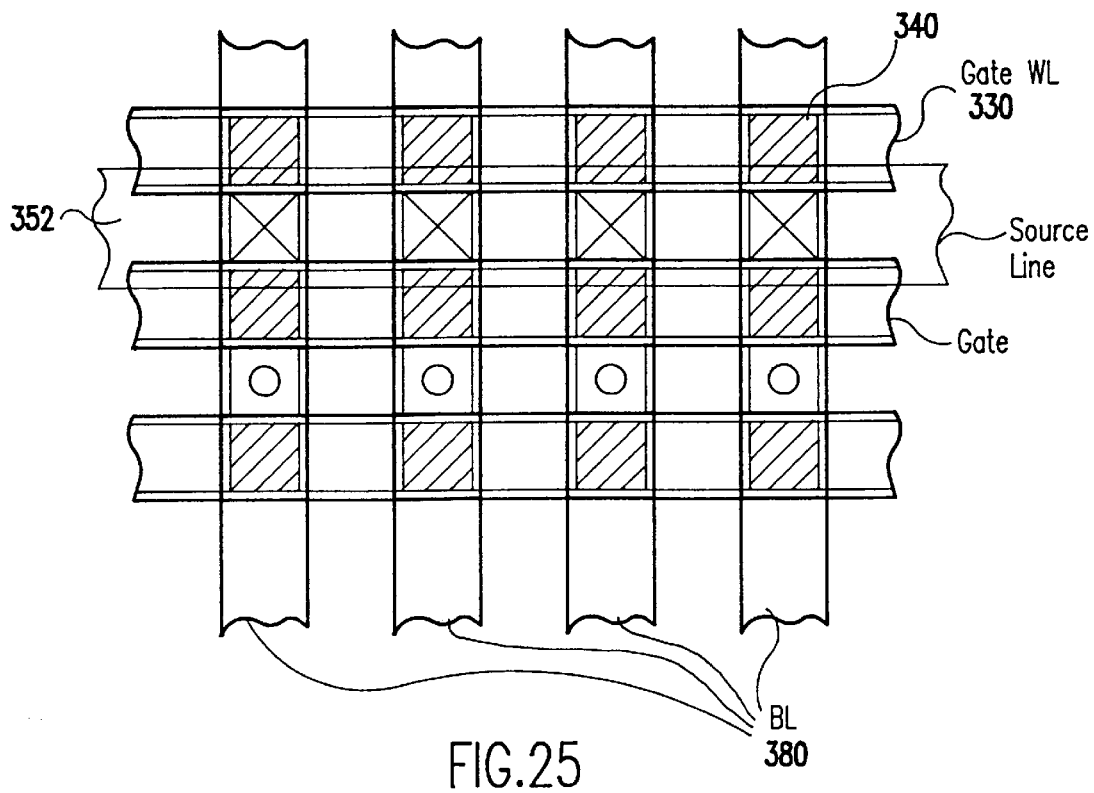
Figure 26:
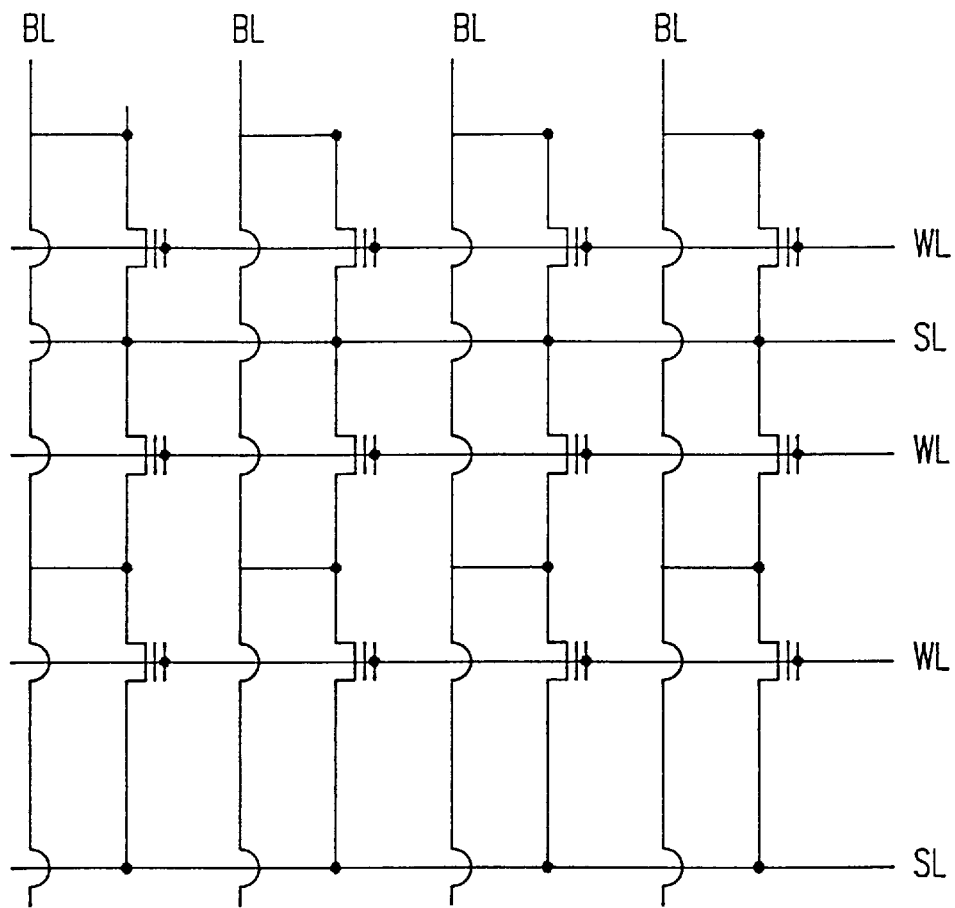
FIG. 26 is a schematic diagram of the circuit of the further embodiment of the invention shown in FIGS. 16–25.

A schematic diagram of the EEPROM circuit thus formed is shown in FIG. 26 and laid out in correspondence with the plan view of FIG. 25. It can readily be seen that the word lines and source lines run horizontally (e.g. row-wise) with one source line provided for each pair of word lines and connect to source nodes between pairs of transistors in each column. Bit lines run vertically in FIG. 26 and connect to drain nodes which also alternate with the source line connections, as discussed above in connection with FIGS. 19–21. Thus any pair of transistors may be selected by application of voltages to a bit line and a source line with selection of a single transistor of that pair selected in accordance with a voltage applied to a word line. The operation of this memory array is otherwise precisely the same as that discussed above in connection with FIG. 15.

In view of the foregoing, it is readily appreciated that the invention provides a simple integrated circuit structure which may be fabricated with a reduced number of highly reliable process steps and which eliminate severe topology which can compromise the integrity of either gate insulation layers or conductors and reduce manufacturing yield. The resulting structure also provides a very high packing density when applied to an EEPROM device and allows metals and refractory metals to be used to provide highly conductive interconnections to the memory cells.

While the invention has been described in terms of a single preferred embodiment and a further embodiment in which cells are individually accessible, those skilled in the art will recognize that the invention can be practiced with modification within the spirit and scope of the appended claims.

Having thus described my invention, what we claim as new and desire to secure by Letters Patent is as follows:

1. An electrically erasable programmable memory having a memory cell including a transistor having a floating gate and a control gate, said transistor including:

at least two isolation structures extending above a substrate at portions of a boundary of said transistor, said at least two isolation structures having respective top planar surfaces each of which includes a material having a hardness sufficient to resist a chemical/mechanical polishing process;

a tunnelling oxide and said floating gate confined between said at least two isolation structures, said floating gate having a surface substantially coplanar with said top planar surfaces of said at least two isolation structures, said surfaces being substantially parallel to a surface of said substrate on which said transistor is formed; and a gate insulator and control electrode of said control gate formed on said coplanar surfaces of said floating gate and said at least two isolation structures.

2. An electrically erasable programmable memory as recited in claim 1, wherein at least one of said floating gate and said control electrode is formed of polysilicon.

3. An electrically erasable programmable memory as recited in claim 1, wherein at least one of said source line and said control electrode is formed of metal.

4. An electrically erasable programmable memory as recited in claim 1, further including at least one field effect transistor including a gate oxide and a gate electrode, portions of a boundary of said gate electrode being confined between at least two isolation structures which extend above said substrate, a surface of said gate electrode having a surface substantially coplanar with a surface of said isolation structures and substantially parallel to a surface of said substrate.

5. An electrically erasable programmable memory as recited in claim 1, further including an array of source lines and an array of bit lines, said source lines and said bit lines being selectively connected to memory cells of said memory.

6. An electrically erasable programmable memory as recited in claim 5, wherein said source lines are positioned orthogonally to said bit lines.

7. An electrically erasable programmable memory as recited in claim 6, wherein drain contacts are formed between transistors of respective memory cells of said memory.

8. An electrically erasable programmable memory as recited in claim 7 wherein said source lines and said bit lines contact alternating drain contacts in a direction orthogonal to commonly connected control electrodes of said transistors of said respective memory cells of said memory.

9. An electrically erasable programmable memory as recited in claim 1, further including a plurality of source/drain regions within said substrate and extending below a portion of said floating gate.

10. An electrically erasable programmable memory as recited in claim 9, further including
a plurality of contacts comprising a contact on each of said plurality of source/drain regions formed of a selectively deposited metal on said substrate,
a source line overlaying said contact and extending in a first coordinate direction, said source line connecting alternate ones of said plurality of contacts, and
a connection extending orthogonally to said source line and connecting remaining alternate ones of said plurality of contacts.

11. The electrically erasable programmable memory recited in claim 1, wherein said top planar surfaces of said at least two isolation structures include a polysilicon layer and a nitride structure, said material including said nitride structure, with said polysilicon layer being planarized back to the nitride structure.

12. An electrically erasable programmable memory having a memory cell which includes a transistor having a floating gate and a control gate formed on a substrate, said transistor comprising:
at least two isolation structures extending above said substrate at portions of a boundary of said transistor and having planar surfaces which include a material of a hardness sufficient to resist a chemical/mechanical polishing process;
a tunnelling oxide and said floating gate confined between said two isolation structures, said floating gate having a surface substantially coplanar with the planar surfaces of said two isolation structures, said surface of said floating gate being substantially parallel to a surface of said substrate on which said transistor is formed; and
a gate insulator and control electrode of said control gate formed on said coplanar surfaces of said floating gate and said two isolation structures.

13. A memory as recited in claim 12, wherein said material includes
a first layer on said two isolation structures; and
a second layer over said first layer;
wherein said second layer is planarized back to said first layer to form the planar surfaces of said two isolation structures.

14. A memory as recited in claim 13, wherein said first layer includes a nitride layer and said second layer includes a polysilicon layer.

15. A memory as recited in claim 13, wherein said second layer is planarized back to said first layer by chemical/mechanical polishing.

* * * * *